(12) United States Patent
Mustafa

(10) Patent No.: US 11,757,050 B2
(45) Date of Patent: Sep. 12, 2023

(54) SYSTEM AND METHOD FOR EXTENDING THE PRACTICAL CUTOFF WAVELENGTH OF ELECTRO-OPTICAL/INFRARED (EO/IR) SENSOR USING PLASMONIC RESONATORS COMPRISING CONVEX POLYHEDRONS AND EACH CONVEX POLYHEDRON HAVING A MESA SHAPE WITH SLOPED SIDES

(71) Applicant: Raytheon Company, Waltham, MA (US)

(72) Inventor: Jamal I. Mustafa, Goleta, CA (US)

(73) Assignee: Raytheon Company, Waltham, MA (US)

( * ) Notice: Subject to any disclaimer, the term of this patent is extended or adjusted under 35 U.S.C. 154(b) by 295 days.

(21) Appl. No.: 16/950,618

(22) Filed: Nov. 17, 2020

(65) Prior Publication Data
US 2022/0158002 A1 May 19, 2022

(51) Int. Cl.
| | | |
|---|---|---|
| *H01L 31/0216* | (2014.01) | |
| *G01J 1/04* | (2006.01) | |
| *H01L 27/144* | (2006.01) | |
| *H01L 31/0304* | (2006.01) | |
| *H01L 31/0352* | (2006.01) | |

(Continued)

(52) U.S. Cl.
CPC ...... *H01L 31/02164* (2013.01); *G01J 1/0407* (2013.01); *G02B 5/008* (2013.01); *G02B 5/1866* (2013.01); *H01L 27/1446* (2013.01); *H01L 31/03046* (2013.01); *H01L 31/035236* (2013.01); *H01L 31/035281* (2013.01);

(Continued)

(58) Field of Classification Search
CPC .......... H01L 27/1446; H01L 31/03046; H01L 31/1844; H01L 31/035281; H01L 31/035236; H01L 31/02164; H01L 31/02327; G01J 1/0407; G01J 1/44; G01J 2001/446; G01J 2001/448; G02B 5/008; G02B 5/1866
USPC ................................................. 250/237, 216
See application file for complete search history.

(56) References Cited

U.S. PATENT DOCUMENTS

| | | | |
|---|---|---|---|
| 8,022,390 B1 * | 9/2011 | Kim ..................... | H01L 27/1446 257/E31.038 |
| 9,472,697 B2 | 10/2016 | Wehner et al. | |

(Continued)

OTHER PUBLICATIONS

Alexander Dorodnyy, et al., "Plasmonic Photodetectors", IEEE Journal of Selected Topics in Quantum Electronics, vol. 24, No. 6, Nov./Dec. 2018, 13 pgs.

(Continued)

*Primary Examiner* — Que Tan Le
*Assistant Examiner* — Mai Thi Ngoc Tran

(57) ABSTRACT

A system includes a substrate. The system also includes a detector array disposed over the substrate, where the detector array includes multiple detector pixels. The system further includes multiple plasmonic gratings disposed over top surfaces of the detector pixels, where each plasmonic grating includes multiple convex polyhedrons separated by valleys. Each detector pixel may have a mesa shape, and the convex polyhedrons of the plasmonic gratings may have a smaller size than the mesa shape of the detector pixels. A dimension across a base of each convex polyhedron of the plasmonic gratings may be selected based on a desired resonance wavelength of the plasmonic gratings.

20 Claims, 6 Drawing Sheets

(51) Int. Cl.
*H01L 31/18* (2006.01)
*G02B 5/00* (2006.01)
*G02B 5/18* (2006.01)
*G01J 1/44* (2006.01)

(52) U.S. Cl.
CPC ............ *H01L 31/1844* (2013.01); *G01J 1/44* (2013.01); *G01J 2001/446* (2013.01)

(56) References Cited

U.S. PATENT DOCUMENTS

| | | | |
|---|---|---|---|
| 9,536,917 B2 | 1/2017 | Wehner et al. | |
| 9,929,291 B2 * | 3/2018 | Smith | ............... H01L 31/02327 |
| 10,830,647 B2 * | 11/2020 | Afzali-Ardakani | ....... G01J 5/20 |
| 2013/0229652 A1 * | 9/2013 | Amako | ................ G01N 21/658 |
| | | | 250/237 G |
| 2019/0259890 A1 | 8/2019 | Lu et al. | |

OTHER PUBLICATIONS

E.M. Jackson, et al., "Two-dimensional plasmonic grating for increased quantum efficiency in midwave infrared nBn detectors with thin absorbers", Optics Express, vol. 26, No. 11, May 28, 2018, pp. 13850-13864.

* cited by examiner

US 11,757,050 B2

SYSTEM AND METHOD FOR EXTENDING THE PRACTICAL CUTOFF WAVELENGTH OF ELECTRO-OPTICAL/INFRARED (EO/IR) SENSOR USING PLASMONIC RESONATORS COMPRISING CONVEX POLYHEDRONS AND EACH CONVEX POLYHEDRON HAVING A MESA SHAPE WITH SLOPED SIDES

TECHNICAL FIELD

This disclosure is directed in general to photodetection systems. More specifically, this disclosure relates to a system and method for extending the practical cutoff wavelength of electro-optical/infrared (EO/IR) sensors using plasmonic resonators.

BACKGROUND

Electro-optical/infrared (EO/IR) sensors typically need to be cooled substantially to achieve usable sensitivity. The operating temperature of an EO/IR sensor is dictated by the cutoff wavelength of the response of the detector material, where longer cutoff wavelengths require lower temperatures to achieve sufficiently small leakage currents. The cooling requirements of an EO/IR sensor largely determine the size, weight, power, and cost (SWaP-C) of the sensor, and lower operating temperatures can dramatically improve SWaP-C. Lower operating temperatures may also require increasingly complex cooling systems that pose reliability concerns and that typically limit the operational lifetimes of the sensors.

SUMMARY

This disclosure provides a system and method for extending the practical cutoff wavelength of electro-optical/infrared (EO/IR) sensors using plasmonic resonators.

In a first embodiment, a system includes a substrate. The system also includes a detector array disposed over the substrate, where the detector array includes multiple detector pixels. The system further includes multiple plasmonic gratings disposed over top surfaces of the detector pixels, where each plasmonic grating includes multiple convex polyhedrons separated by valleys.

In a second embodiment, a method includes obtaining a substrate. The method also includes providing a detector array disposed over the substrate, where the detector array includes multiple detector pixels. The method further includes providing multiple plasmonic gratings disposed over top surfaces of the detector pixels, where each plasmonic grating includes multiple convex polyhedrons separated by valleys.

In a third embodiment, a system includes a substrate. The system also includes a detector array disposed over the substrate, where the detector array includes multiple detector pixels. The system further includes multiple plasmonic gratings disposed over top surfaces of the detector pixels, where each plasmonic grating includes multiple convex polyhedrons separated by valleys. Each detector pixel has a mesa shape, and the convex polyhedrons of the plasmonic gratings have a smaller size than the mesa shape of the detector pixels. A dimension across a base of each convex polyhedron of the plasmonic gratings is selected based on a desired resonance wavelength of the plasmonic gratings.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
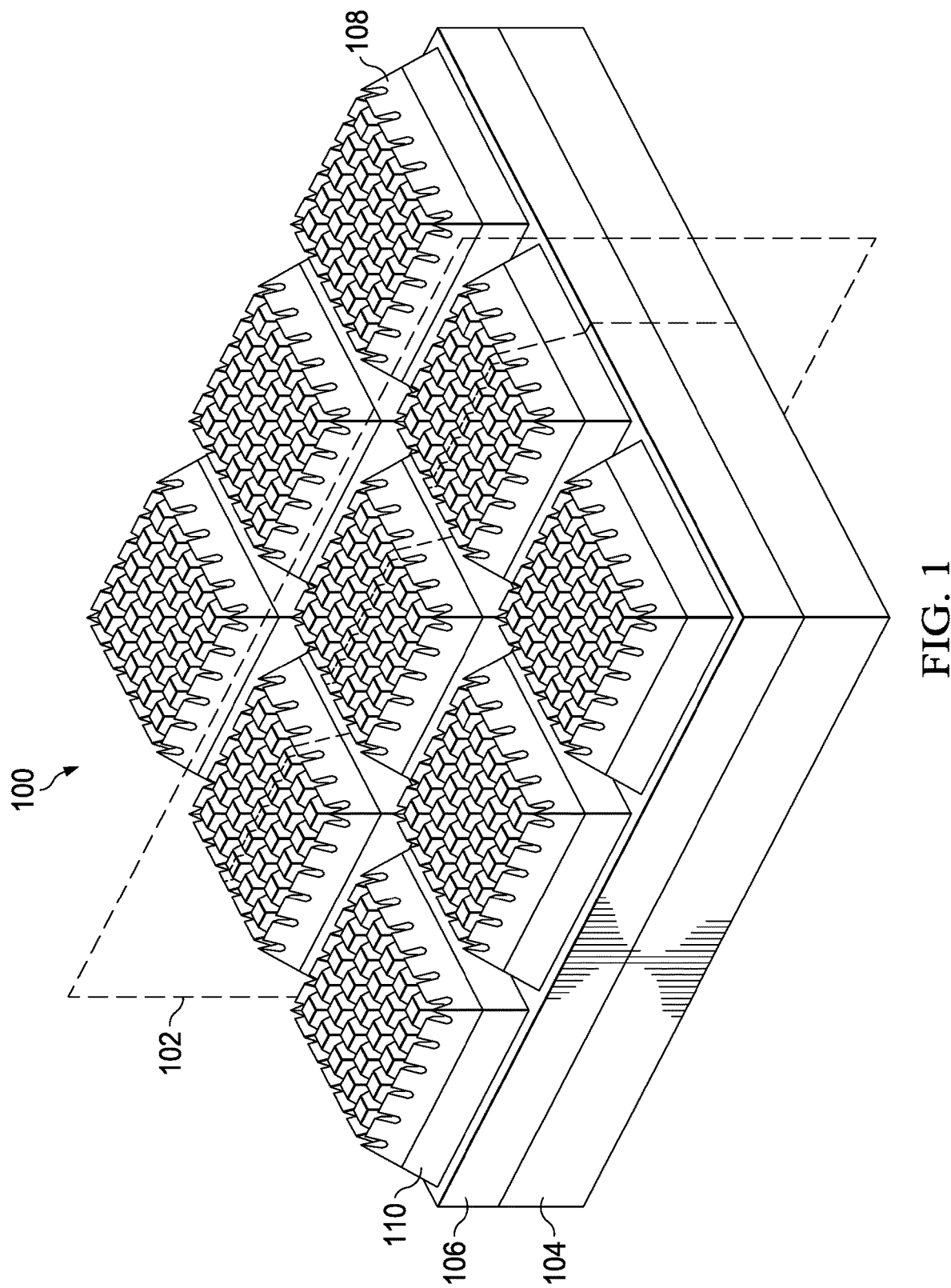
FIGS. 1 and 2 illustrate an example sensor system according to this disclosure.

FIGS. 1 through 8, described below, and the various embodiments used to describe the principles of the present disclosure in this patent document are by way of illustration only and should not be construed in any way to limit the scope of the disclosure. Those skilled in the art will understand that the principles of the present disclosure may be implemented in any type of suitably arranged device or system.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure. It will be understood that embodiments of this disclosure may include any one, more than one, or all of the features described here. Also, embodiments of this disclosure may additionally or alternatively include other features not listed here.

As discussed above, electro-optical/infrared (EO/IR) sensors typically need to be cooled substantially to achieve usable sensitivity. The operating temperature of an EO/IR sensor is dictated by the cutoff wavelength of the response of the detector material, where longer cutoff wavelengths require lower temperatures to achieve sufficiently small leakage currents. The cooling requirements of an EO/IR sensor largely determine the size, weight, power, and cost (SWaP-C) of the sensor, and lower operating temperatures can dramatically improve SWaP-C. Lower operating temperatures may also require increasingly complex cooling systems that pose reliability concerns and that typically limit the operational lifetimes of the sensors. At higher operating temperatures, the sensitivity of EO/IR sensors realized with photodiodes can be limited by diffusion currents, which depend on minority carrier concentrations in an absorber material and the volume of the absorber. Some conventional techniques use non-equilibrium structures to reduce the carrier concentrations and realize lower leakage currents. Plasmonic structures have been used in thin or small absorber structures to decrease the volume for leakage current generation, but plasmonic structures typically have narrow-band responsivity.

This disclosure provides systems and methods for extending the practical cutoff wavelength of EO/IR sensors using one or more plasmonic resonators. Rather than reducing dark currents through volume reduction, the disclosed systems and methods employ a structure with a shorter cutoff wavelength and extend the practical cutoff wavelength by concentrating the incident electromagnetic radiation using a plasmonic grating and leveraging the absorption tail in the absorber. In some embodiments, the disclosed systems and methods can be used for various commercial, law enforcement, or defense-related applications, such as in target tracking or identifying devices mounted in aircraft, sea vessels, land-based vehicles, or handheld or stationary weapons or trackers. While not specifically listed here, any other suitable applications are within the scope of this disclosure.

Figure 2:
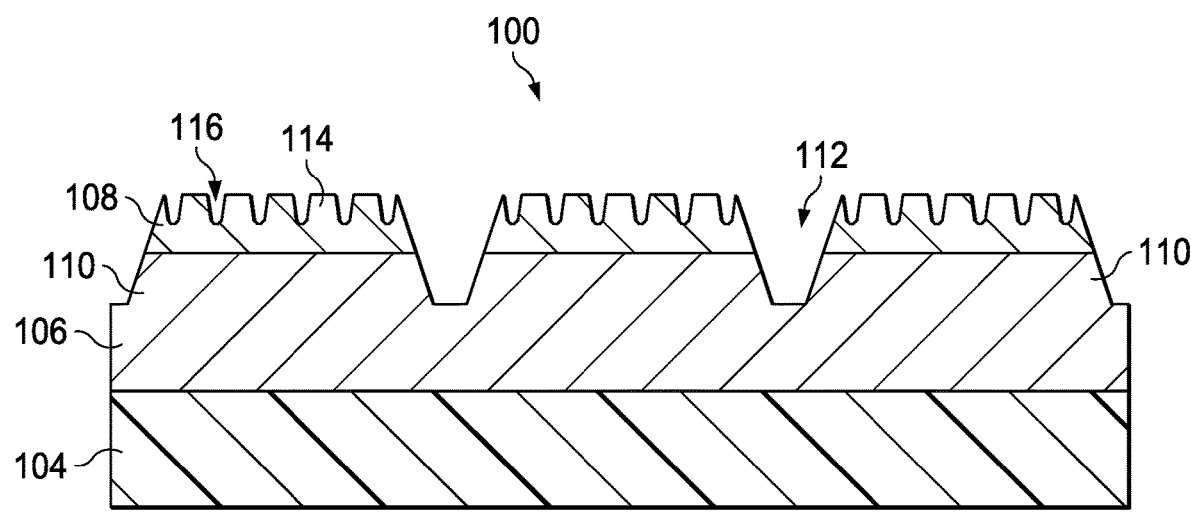

FIGS. 1 and 2 illustrate an example sensor system 100 according to this disclosure. In particular, FIG. 1 illustrates a three-dimensional (3D) perspective view of the sensor system 100, and FIG. 2 illustrates a cross-sectional view of the sensor system 100 taken along a plane 102 shown in FIG. 1.

As shown in FIGS. 1 and 2, the sensor system 100 includes a substrate 104, a detector array 106, and plasmonic gratings 108. In some embodiments, the sensor system 100 includes or represents one or more EO/IR sensors. The substrate 104 provides a supportive structure over which the detector array 106 is disposed. The substrate 104 can include any suitable supportive structure that is formed from any suitable material(s). The substrate 104 may also be formed in any suitable manner.

The detector array 106 includes an array of detector pixels 110, which may be arranged in a grid pattern. Each detector pixel 110 includes one or more materials that, when illuminated with electromagnetic radiation, generate an electrical current that can be output for measurement, generation of an image, and the like. For example, in some embodiments, each detector pixel 110 can include one or more photodiodes. In FIG. 1, the detector array 106 is arranged in a three-by-three grid pattern, but this is merely a simplified example. In many practical applications, the detector array 106 may include tens, hundreds, or thousands of detector pixels 110 in each dimension. In some embodiments, the detector array 106 is at least partially formed from strained-layer superlattices composed of layers of indium arsenide (InAs) and the ternary alloy indium arsenide antimonide (InAsSb). However, this is merely one example, and the detector array 106 can be formed from any suitable material(s). The detector array 106 may also be formed in any suitable manner.

Each detector pixel 110 in the detector array 106 has a shape that is similar to a truncated pyramid, which is also referred to as a "mesa." As shown in FIG. 2, each of the detector pixels 110 has sloped sides and a flat top surface, which is similar to a mesa in physical geography. The mesa-shaped detector pixels 110 are separated by valleys 112. In the sensor system 100, the detector pixels 110 can have mesas of the same size, shape, and height, where the mesas are separated by valleys 112 that are all the same size. This results in a substantially uniform sensor system 100. However, this is merely one example, and different detector pixels 110 in the detector array 106 may have different sizes, shapes, and/or heights and may or may not be separated by valleys 112 of different sizes.

Each of the plasmonic gratings 108 forms a plasmonic resonator disposed over the top surface of one of the detector pixels 110 in the detector array 106, where the plasmonic resonators are configured to confine and enhance an electromagnetic field. In some embodiments, the plasmonic grating 108 can be formed from a different material than the detector array 106. For example, the plasmonic grating 108 may be at least partially formed from the ternary alloy InAsSb, while the detector array 106 is at least partially formed from strained-layer superlattices composed of layers of InAs and the ternary alloy InAsSb. Of course, alternative or additional materials may be used in the plasmonic gratings 108, such as other III-IV ternary alloys. Also, in other embodiments, the plasmonic gratings 108 can be formed from the same material as the detector array 106.

Each plasmonic grating 108 includes multiple convex polyhedrons 114 that are arranged in a grid and that are separated by valleys 116. In some embodiments, such as shown in FIG. 2, the convex polyhedrons 114 have a mesa shape, similar to the detector pixels 110. In other embodiments, the convex polyhedrons 114 can have additional or alternative shapes, such as cuboids, pyramids, polygonal prisms, and the like. As shown in FIG. 2, the convex polyhedrons 114 are much smaller than the mesa shape of the detector pixels 110. As a result of the smaller size, the convex polyhedrons 114 interact with incoming electromagnetic radiation in a different manner than the detector pixels 110 do. Plasmonic materials in general respond very strongly to electromagnetic radiation in a narrow wavelength band. As discussed in greater detail below, the plasmonic gratings 108 are tunable to a particular wavelength or wavelength band, such as by changing the dimensions of the convex polyhedrons 114.

Figure 3:
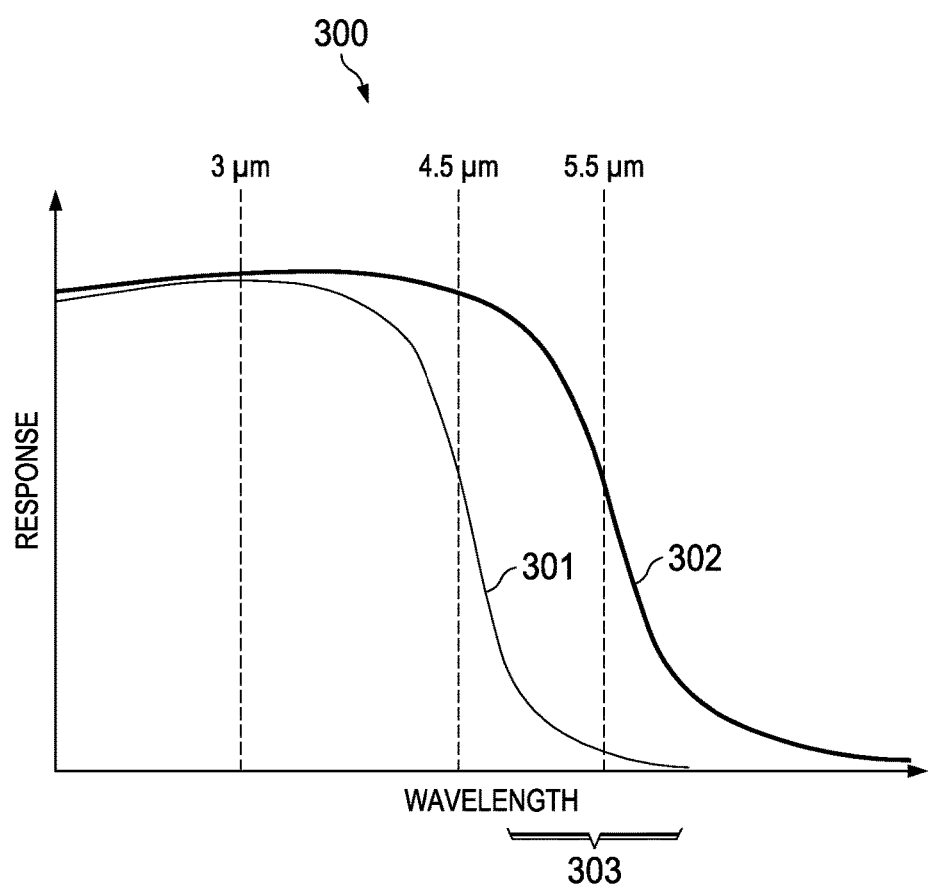
FIG. 3 illustrates an example chart depicting simplified spectral response curves for a detector according to this disclosure.

To better illustrate the principles of the plasmonic gratings 108, FIG. 3 illustrates an example chart 300 depicting simplified spectral response curves for a detector according to this disclosure. As shown in FIG. 3, the X-axis of the chart 300 represents the wavelength of electromagnetic radiation that is received by the detector, and the Y-axis of the chart 300 represents the response of the detector for the given wavelength of electromagnetic radiation. Here, the response of the detector may represent an electrical current output from the detector. As shown in the chart 300, the wavelengths of interest may be on the order of about 3 µm to about 5.5 µm. However, this is merely one example, and other embodiments may include detectors tuned for other wavelengths or wavelength bands.

In the chart 300, a plot 301 represents an output of a detector that does not include plasmonic gratings. The plot 301 shows that the detector has a very good response at wavelengths below a threshold cutoff value, meaning the detector absorbs most or all of the electromagnetic radiation and generates a relatively high current. Above the threshold cutoff wavelength, the detector exhibits much poorer response, meaning the detector absorbs a smaller percentage of the incident electromagnetic radiation and generates relatively low current. As indicated by a tail 303 of the plot 301, the detector exhibits a small response at higher wavelengths, but such a small response is not practically useful. Thus, the practical response is "cut off" above the threshold value.

Depending on the application, it may be desirable for a detector to be responsive to electromagnetic radiation in a larger wavelength band. As shown in FIG. 3, for the detector to "see" longer wavelength electromagnetic radiation, the response curve of the detector should be transformed from the plot 301 to a plot 302. That is, the desired response curve of the detector should be broader and shifted to the right, with a higher threshold cutoff wavelength as indicated by the plot 302.

Figure 4:
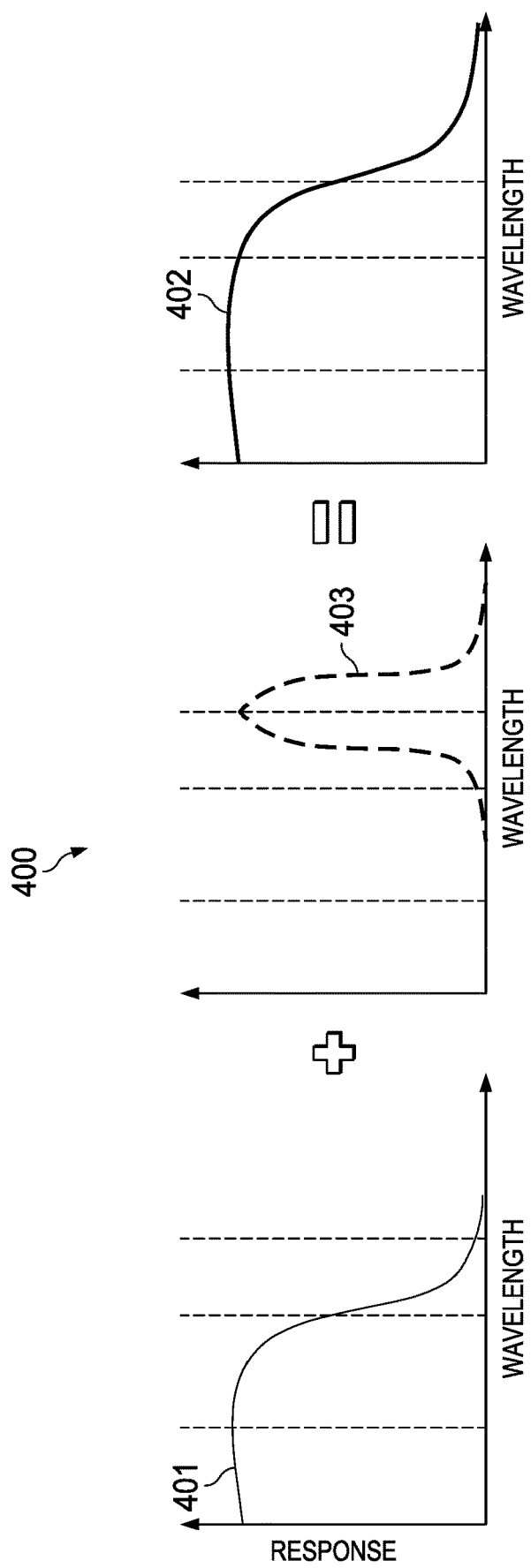
FIG. 4 illustrates an example chart depicting simplified spectral response curves for the sensor system of FIGS. 1 and 2 according to this disclosure.

A technique to transform the response curve of the detector from the plot 301 to the plot 302 is to use plasmonic resonators, such as the plasmonic gratings 108, on the detector elements. For example, FIG. 4 illustrates an example chart 400 depicting simplified spectral response curves for the sensor system 100 according to this disclosure. As shown in FIG. 4, a plot 401 represents a response curve for the sensor system 100 if the sensor system 100 does not include the plasmonic gratings 108. Also, a plot 402 represents a response curve for the sensor system 100 with the plasmonic gratings 108. The response curve represented by the plot 402 is broader and shifted to higher wavelengths compared to the plot 401, which is analogous to the plots 301 and 302 of FIG. 3. The response curve represented by the plot 401 summed with the response curve represented by a plot 403 results in the response curve represented by the plot 402. The plot 403 represents additional response (such as additional current) generated by the sensor system 100 due to the presence of the plasmonic gratings 108.

The plasmonic gratings 108 are tuned to operate with the detector array 106 to smoothly extend the responsivity cutoff of the detector array 106. Thus, the plasmonic gratings 108 operate to transform the detector array 106 from a shorter cutoff detector material into a longer cutoff material. Although the cutoff of a material describes the wavelength above which electromagnetic radiation is not absorbed effectively, there can weak absorption at longer wavelengths as indicated by the tail 303 in FIG. 3. By concentrating the incoming electromagnetic radiation using plasmonic resonance, the plasmonic gratings 108 exploit this weak absorption to realize practical absorption at longer wavelengths. The plasmonic gratings 108 do not operate as primary absorbers themselves but instead act as structures to strongly couple with the incoming electromagnetic radiation and enhance absorption in the absorber material(s) of the detector pixels 110.

The plasmonic gratings 108 can concentrate electromagnetic radiation having one or more wavelengths near the desired cutoff wavelength as indicated by the peak of the plot 403. This extends the responsivity of the detector pixels 110, which would have a shorter cutoff wavelength without the plasmonic gratings 108. Concentrating the electromagnetic radiation leads to an effectively longer optical path in the absorber material(s) of each detector pixel 110, which enhances absorption near the cutoff wavelength. The ability to use a detector array 106 (that otherwise has a shorter cutoff wavelength) with the plasmonic gratings 108 to absorb longer wavelengths can reduce cooling requirements, since the cooling power needed is typically less with shorter cutoff materials. Additionally, some systems have an intrinsic cutoff wavelength that makes them unsuitable for particular spectral bands of interest. Extending the practical cutoff wavelength by using plasmonic resonators, such as the plasmonic gratings 108, allows for their application, which may lead to more easily-manufacturable detector devices.

The wavelength of the electromagnetic radiation at which resonance occurs in a plasmonic grating 108 can vary depending on the geometric structure and dimensions of the convex polyhedrons 114 and the material used for the plasmonic grating 108. Adjustment to one or more of these properties provides a technique for tailoring the response of the plasmonic gratings 108 and, in turn, the response of the sensor system 100. In particular, adjustment of the material(s) forming the plasmonic gratings 108, one or more dimensions of the convex polyhedrons 114, or a combination of these can result in a shift in the peak of the plot 403.

Figure 5C:
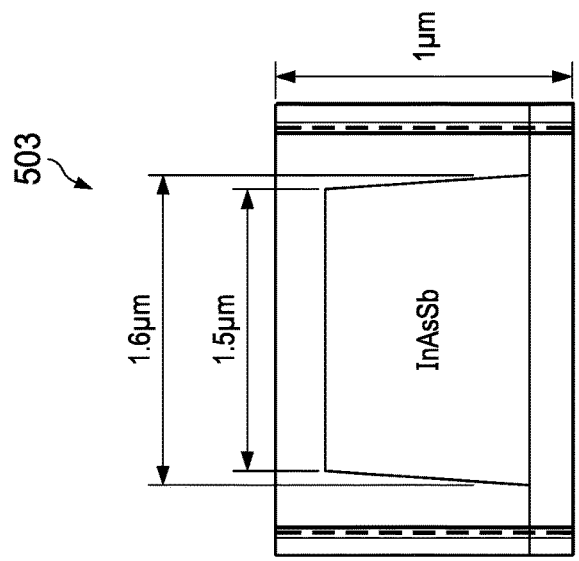
FIGS. 5A through 5C illustrate cross-sectional views of three example mesas having different sizes according to this disclosure.
Figure 5B:
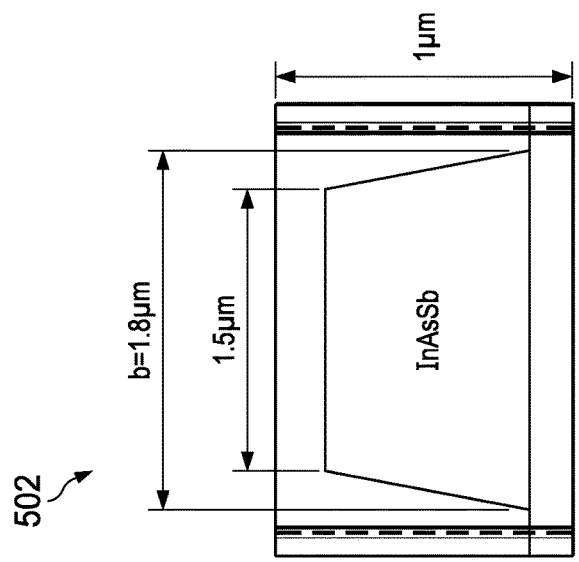
Figure 5A:
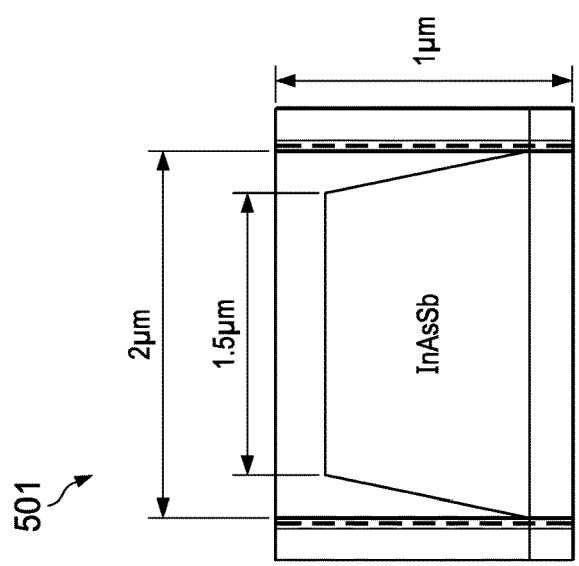

FIGS. 5A through 5C illustrate cross-sectional views of three example mesas 501-503 having different sizes according to this disclosure. Each of the mesas 501-503 can represent (or be represented by) one of the convex polyhedrons 114 that form part of the plasmonic gratings 108 of FIGS. 1 and 2. As shown in FIGS. 5A through 5C, each mesa 501-503 has a height of approximately 1 μm and a top surface that is approximately 1.5 μm across. However, the mesas 501-503 have different sizes at their bases. For example, the mesa 501 is approximately 2 μm across at its base, the mesa 502 is approximately 1.8 μm across at its base, and the mesa 503 is approximately 1.6 μm across at its base. The different widths at the bases of the mesas 501-503 result in different resonance wavelengths.

Figure 6:
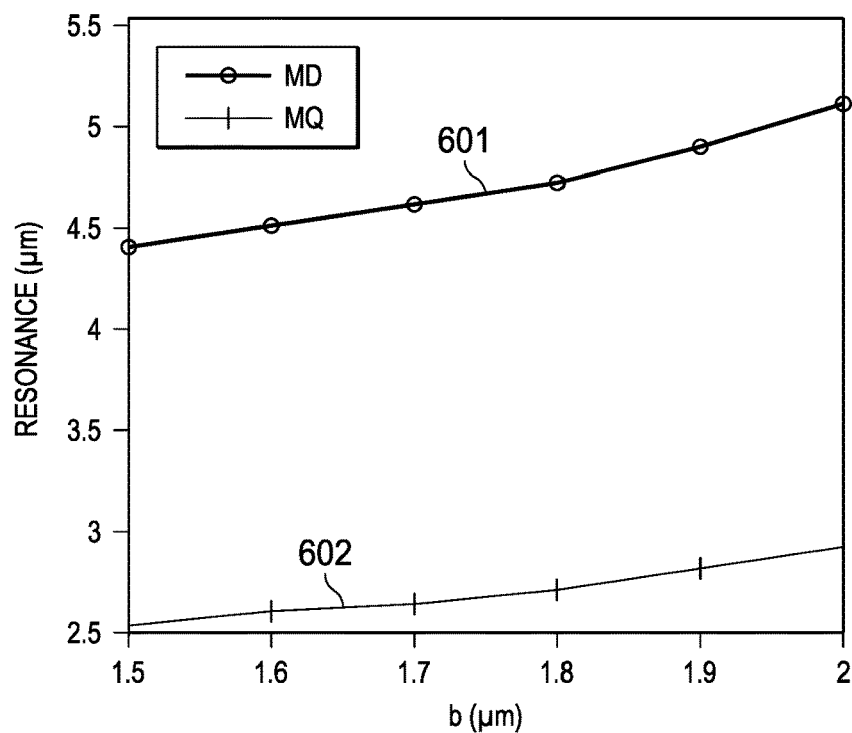
FIG. 6 illustrates an example chart showing resonance wavelength as a function of the size of a base of a mesa according to this disclosure.

FIG. 6 illustrates an example chart 600 showing resonance wavelength as a function of the size of a base of a mesa according to this disclosure. In the chart 600, the dimension b, which corresponds to the dimension across the base of the mesas 501-503, is plotted on the X-axis of the chart 600, while the resonance wavelength is plotted on the Y-axis of the chart 600. A plot 601 shows a magnetic dipole (MD) mode, and a plot 602 shows a magnetic quadrupole (MQ) mode. As the base dimension b increases, both the MD mode resonance wavelength and the MQ mode resonance wavelength also increase. If a desired resonance wavelength is known, it is therefore possible to select a base dimension b for the convex polyhedrons of the plasmonic gratings 108 that will result in the desired resonance wavelength. This can be used to design and fabricate a sensor system 100.

Figure 7:
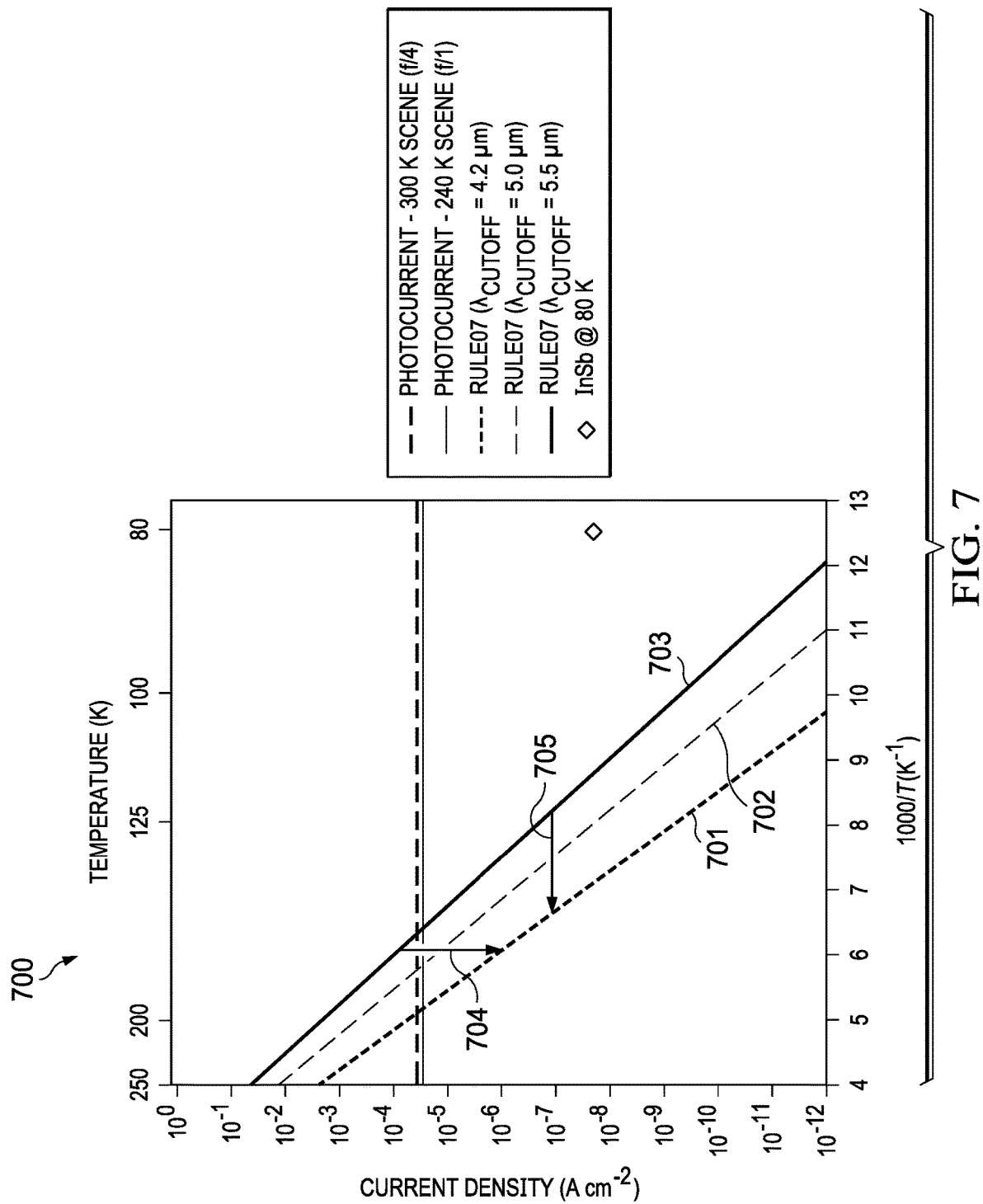
FIG. 7 illustrates an example chart showing dark current density as a function of operating temperature and cutoff wavelength in a sensor according to this disclosure.

FIG. 7 illustrates an example chart 700 showing dark current density as a function of operating temperature and cutoff wavelength in a sensor according to this disclosure. Dark current density refers to noise that limits the sensitivity of a detector. In FIG. 7, plots 701-703 in the chart 700 show estimated "Rule 07" dark current densities as a function of operating temperature for three discrete cutoff wavelengths (4.2 μm, 5.0 μm, and 5.5 μm), respectively. By choosing different materials with different cutoff wavelengths, it is possible to achieve desired results. For example, an arrow 704 shows that, for a given operating temperature (such as 166 K), the dark current density can be significantly reduced by selecting materials and structures with a different cutoff wavelength. Also, an arrow 705 shows that, for a given dark current density, increases in operating temperature are possible by choosing materials and structures with a different cutoff wavelength. Note that the values shown in FIG. 7 are representative of particular materials, wavelengths, and temperatures. In other embodiments, other selections of materials, wavelengths, and temperatures would result in different plot lines, and such results are within the scope of this disclosure.

As disclosed here, the sensor system 100 uses structures that exhibit shorter cutoff wavelengths at higher operating temperatures and improves absorption at longer wavelengths using the plasmonic gratings 108. This enables higher operating temperatures without the increased dark currents that typically occur at elevated temperatures. Note that while often described as using plasmonic gratings 108 here, the principles of the sensor system 100 can be extended to other plasmonic structures.

Although FIGS. 1 through 7 illustrate one example of a sensor system 100 and related details, various changes may be made to FIGS. 1 through 7. For example, the sensor system 100 and its individual components may have any suitable sizes, shapes, and dimensions. As a particular example, the plasmonic gratings 108 can include various geometrical structures, including cuboids, pyramids, and the like. Also, various components in the sensor system 100 may be combined, further subdivided, replicated, rearranged, or omitted and additional components may be added according to particular needs. As a particular example, the sensor system 100 may include multiple detector arrays 106, such as those that use additional or alternative electro-optical or infrared photodetector technologies.

Figure 8:
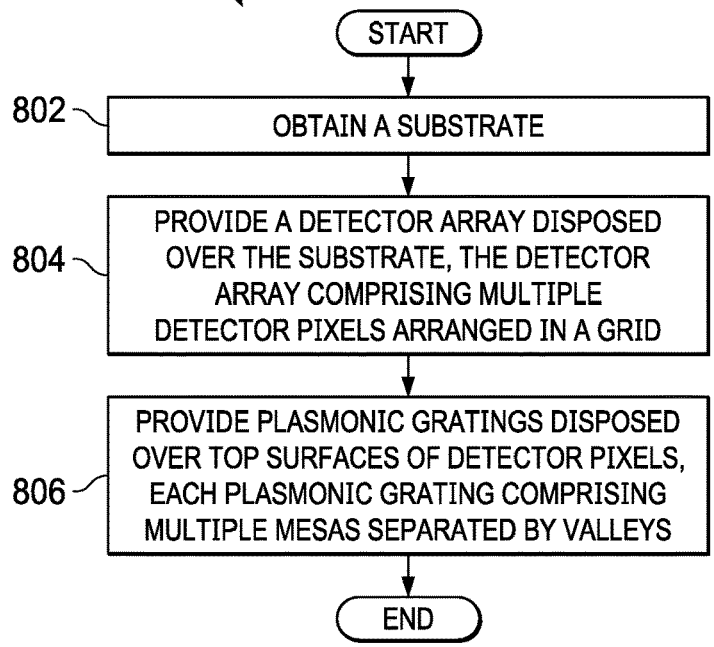
FIG. 8 illustrates an example method for operating a sensor system according to this disclosure.

FIG. 8 illustrates an example method 800 for creating a sensor system according to this disclosure. For ease of explanation, the method 800 is described as involving the formation of the sensor system 100 of FIGS. 1 and 2. However, the method 800 may be used to form any other suitable sensor system designed in accordance with the teachings of this disclosure.

As shown in FIG. 8, a substrate is obtained at step 802. This may include, for example, forming or otherwise obtaining the substrate 104. A detector array disposed over the substrate is provided at step 804. This may include, for example, forming or otherwise providing the detector array 106 over the substrate 104, where the detector array 106 includes the detector pixels 110 (possibly arranged in a grid). The detector array includes multiple detector pixels 110.

Plasmonic gratings disposed over top surfaces of the detector pixels are provided at step 806. This may include, for example, forming or otherwise providing a plasmonic grating 108 on the top surface of each of the detector pixels 110. Each plasmonic grating 108 includes multiple convex polyhedrons 114 separated by valleys 116. In some embodiments, the plasmonic gratings 108 are formed from a different material than the detector array 106. In other embodiments, the plasmonic gratings 108 are formed from a same material as the detector array 106.

Although FIG. 8 illustrates one example of a method 800 for creating a sensor system 100, various changes may be made to FIG. 8. For example, while shown as a series of steps, various steps shown in FIG. 8 may overlap, occur in parallel, occur in a different order, or occur multiple times. Also, some steps may be combined or removed and additional steps may be added according to particular needs.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," or "system" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system comprising:
a substrate;
a detector array disposed over the substrate, the detector array comprising multiple detector pixels; and
multiple plasmonic gratings disposed over top surfaces of the detector pixels, each plasmonic grating comprising multiple convex polyhedrons separated by valleys, each convex polyhedron having a mesa shape with sloped sides such that a base of each convex polyhedron is larger than a top surface of that convex polyhedron.

2. The system of claim 1, wherein the plasmonic gratings are configured to extend a cutoff wavelength of the detector array.

3. The system of claim 1, wherein:
each detector pixel has a mesa shape; and
the convex polyhedrons of the plasmonic gratings have a smaller size than the mesa shape of the detector pixels.

4. The system of claim 1, wherein the plasmonic gratings are formed from a different material than the detector array.

5. The system of claim 1, wherein the detector array comprises indium arsenide (InAs) and indium arsenide antimonide (InAsSb).

6. The system of claim 1, wherein the plasmonic gratings comprise indium arsenide antimonide (InAsSb).

7. The system of claim 1, wherein the plasmonic gratings are formed from a same material as the detector array.

8. The system of claim 1, wherein a dimension across the base of each convex polyhedron of the plasmonic gratings is selected based on a desired resonance wavelength of the plasmonic gratings.

9. The system of claim 8, wherein the dimension across the base of each convex polyhedron is selected to be in a range of about 1.5 μm to about 2.0 μm.

10. The system of claim 1, wherein one or more first detector pixels of the detector array and one or more second detector pixels of the detector array have at least one of: different sizes, different shapes, and different heights.

11. A method comprising:
obtaining a substrate;
providing a detector array disposed over the substrate, the detector array comprising multiple detector pixels; and
providing multiple plasmonic gratings disposed over top surfaces of the detector pixels, each plasmonic grating comprising multiple convex polyhedrons separated by valleys, each convex polyhedron having a mesa shape with sloped sides such that a base of each convex polyhedron is larger than a top surface of that convex polyhedron.

12. The method of claim 11, wherein the plasmonic gratings are configured to extend a cutoff wavelength of the detector array.

13. The method of claim 11, wherein:
each detector pixel has a mesa shape; and
the convex polyhedrons of the plasmonic gratings have a smaller size than the mesa shape of the detector pixels.

14. The method of claim 11, wherein the plasmonic gratings are formed from a different material than the detector array.

15. The method of claim 11, wherein the detector array comprises indium arsenide (InAs) and indium arsenide antimonide (InAsSb).

16. The method of claim 11, wherein the plasmonic gratings comprise indium arsenide antimonide (InAsSb).

17. The method of claim 11, wherein the plasmonic gratings are formed from a same material as the detector array.

18. The method of claim 11, wherein a dimension across the base of each convex polyhedron of the plasmonic gratings is selected based on a desired resonance wavelength of the plasmonic gratings.

19. The method of claim 18, wherein the dimension across the base of each convex polyhedron is selected to be in a range of about 1.5 μm to about 2.0 μm.

20. A system comprising:
a substrate;
a detector array disposed over the substrate, the detector array comprising multiple detector pixels; and
multiple plasmonic gratings disposed over top surfaces of the detector pixels, each plasmonic grating comprising multiple convex polyhedrons separated by valleys, each convex polyhedron having a mesa shape with sloped sides such that a base of each convex polyhedron is larger than a top surface of that convex polyhedron;
wherein each detector pixel has a mesa shape;
wherein the convex polyhedrons of the plasmonic gratings have a smaller size than the mesa shape of the detector pixels; and
wherein a dimension across a base of each mesa of the plasmonic gratings is selected based on a desired resonance wavelength of the plasmonic gratings.

* * * * *